United States Patent [19]

Yamaguchi et al.

[11] Patent Number: 4,956,795
[45] Date of Patent: Sep. 11, 1990

[54] SIGNAL CONDITIONERS

[75] Inventors: Kenji Yamaguchi; Yohta Furukawa, both of Tokyo, Japan

[73] Assignee: Yokogawa Electric Corporation, Tokyo, Japan

[21] Appl. No.: 246,289

[22] Filed: Sep. 20, 1988

[30] Foreign Application Priority Data

Feb. 4, 1988 [JP] Japan .................................. 63-24671
Feb. 12, 1988 [JP] Japan .................................. 63-30609

[51] Int. Cl.⁵ ............................................. G06F 15/20
[52] U.S. Cl. .................................. 364/571.03; 73/708; 364/571.04
[58] Field of Search ............. 73/708; 364/557, 571.02, 364/571.03, 571.04

[56] References Cited

U.S. PATENT DOCUMENTS

| | | | |
|---|---|---|---|
| 4,468,968 | 9/1984 | Kee ........................................ | 73/708 |
| 4,562,554 | 12/1985 | Stixrud et al. .................... | 364/557 X |
| 4,575,806 | 3/1986 | Aldrich et al. ........................ | 364/557 |
| 4,588,308 | 5/1986 | Saito ............................ | 364/571.03 X |
| 4,592,002 | 5/1986 | Bozarth, Jr. et al. ........... | 364/571.03 |
| 4,734,873 | 3/1988 | Malloy et al. ................. | 364/571.03 |
| 4,765,188 | 8/1988 | Krechmery et al. ................. | 73/708 |
| 4,856,317 | 8/1989 | Pinorenko et al. ........ | 364/571.04 X |
| 4,870,863 | 10/1989 | Duncan et al. ............ | 364/571.04 X |
| 4,872,349 | 10/1989 | Espiritu-Santo .................. | 73/708 X |

Primary Examiner—Parshotam S. Lall
Assistant Examiner—Edward R. Cosimano
Attorney, Agent, or Firm—Moonray Kojima

[57] ABSTRACT

A signal conditioner for converting non-standardized analog signals from a variety of sensors of temperature, pressure, and flow rate, into standardized signals which are accurately readable by a computer; wherein an analog to digital converter converts the non-standardized analog signal into a digital signal, arithmetic circuit effects a predetermined arithmetic operation on the digital signal, pulse outputting circuit takes the arithmetic results and generates a pulse signal having duty ratio corresponding thereto, and filter circuit smooths the pulse signal and generates the standardized signal which represents the non-standardized analog signal from the different sensors.

11 Claims, 10 Drawing Sheets

SIGNAL CONDITIONERS

BACKGROUND OF THE INVENTION

1. Field of Invention

This invention relates to a signal conditioner for converting signals, pertaining to temperature, pressure and flow rate, which are transmitted from sensors, into unified standard signals which are accurately readable by a computer; and more particulary, to a signal conditioner which is equipped with a microprocessor and performs functions which linearize the input signals and effect multiple correction arithmetic operations or averaging arithmetic operations.

2. Description of Prior Art.

Signal receiving instruments, such as recorders, controllers or the like, which are currently in use, are constructed to receive standard signals of, e.g. 1 to 5 V or 4 to 20 mA. For this reason, it is necessary to provide a converter for converting the signals transmitted from a thermocouple, temperature measuring resistor, or other sensors, into standard signals which the signal receiving instrument is capable of receiving.

Some conventional converters of this type are arranged according to the types of sensors used, ranges or spans of input signals received, and arithmetic functions used.

There exists, however, a large number of types of sensors and ranges and spans of input signals. Thus, it is difficult to provide corresponding hardware converters or to easily adjust these converters.

SUMMARY OF THE INVENTION

An object of the invention is to provide a signal conditioner which is capable of facilitating changes of types of sensors, ranges or spans of signals, and which flexibly corresponds to variations in engineering factors.

The foregoing and other objects are attained by the invention, wherein a signal conditioner is provided which is capable of performing signal conversion with high accuracy by enhancing the resolving power of an analog to digital (A/D) converter for converting signals transmitted from the sensors, into digital signals which are readable by a microprocessor.

According to one aspect of the invention, there is provided a highly reliable signal conditioner which is capable of reliably holding a stored data retention time for a longer stretch of time than, for example, 10 years, while maintaining the data rewriting function in an EEPROM designed for retention of a wide variety of data.

According to another aspect of the invention, there is provided a signal conditioner which is not influenced by the resistances of the lead wires which are coupled to the sensors.

DESCRIPTION OF THE PREFERRED EMBODIMENTS.

Figure 1:
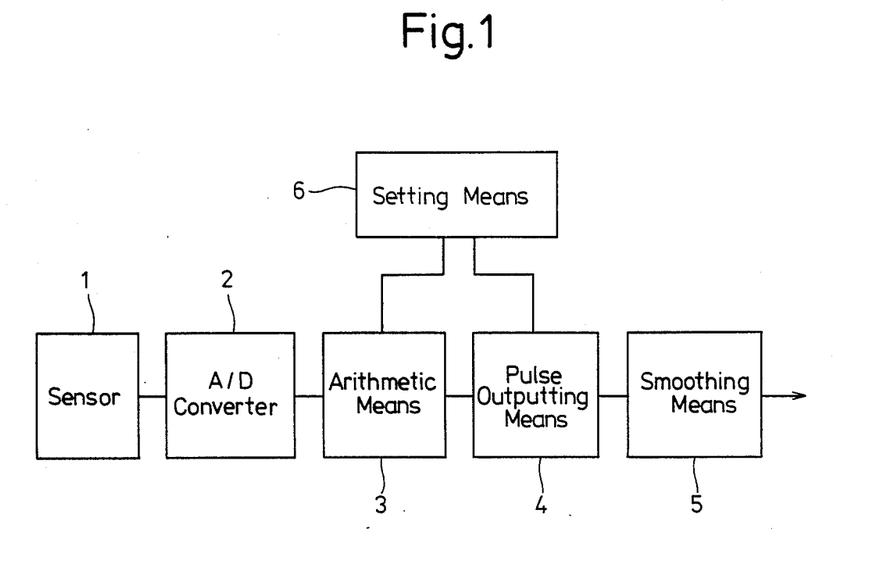
FIG. 1 is a block diagram depicting an important function of the invention.

In FIG. 1, the embodiment comprises a sensor 1; an A/D converter 2 for converting a signal sent from sensor 1 into a digital signal; arithmetic means 3 for performing a predetermined arithmetic operation on the digital signal corresponding to the signal from the sensor 1; pulse outputting means 4 for outputting a pulse signal with a duty ratio corresponding to the arithmetic result; smoothing means 5 for smoothing the pulse signals from pulse outputting means 4 to output the smoothed pulses as predetermined standard signals; and setting means 6 for setting data used for the digital arithmetic operation by arithmetic means 3 and for outputting conditions of the pulse outputting means by receiving signals from the outside.

The signals transmitted from sensor 1 are converted into the digital signals by means of A/D converter 2 and are then applied to arithmetic means 3. The data on the type of sensor 1 and the range of signal, which are sent from the setting means 6, are set in arithmetic means 3. Arithmetic means 3 performs the digital arithmetic operation n conformity with a predetermined arithmetic formula by using the data. The arithmetic results are converted into pulse signals by pulse outputting means 4 on the basis of data on the range or span set by the setting means, and further converted into standard signals through smoothing means 5. Subsequently, the thus converted standard signals are outputted.

Figure 2:
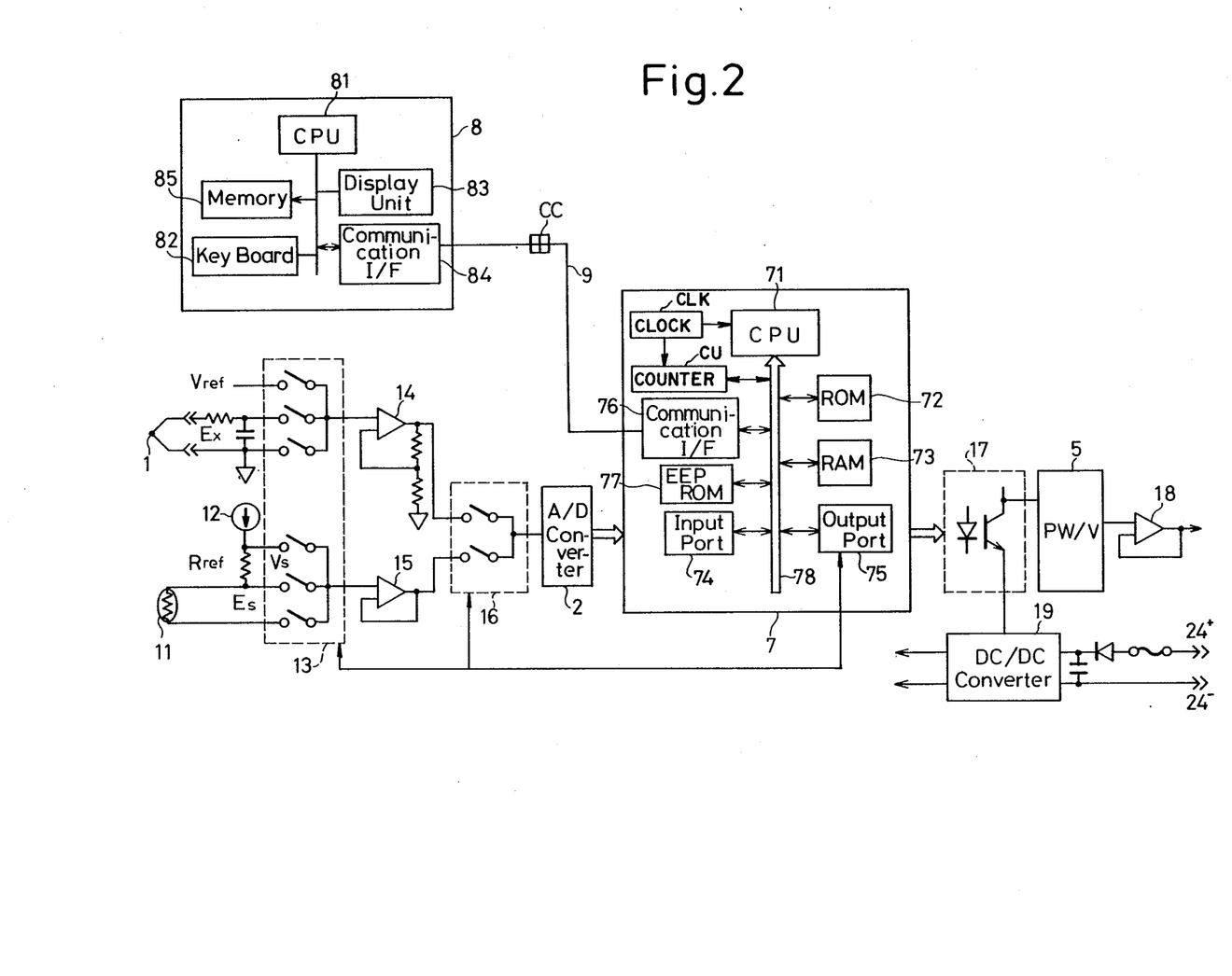
FIG. 2 is a block diagram depicting an illustrative embodiment of the invention.

Turning now to FIG. 2, the components corresponding to those depicted in FIG. 1 are marked with the same symbols. A thermocouple which is used to detect temperatures, is used as sensor 1. The embodiment comprises the temperature sensor 11 for detecting a reference contact temperature and comprises e.g. a termistor; a constant current source 12 for supplying a constant current through a resistance $R_{ref}$; a first multiplexer 13 for sequentially selecting and receiving a reference voltage $V_{ref}$, a thermoelectromotive force signal $E_x$ transmitted from thermocouple 1, a double sided voltage $V_s$ and temperature signals $E_s$ sent from thermistor 11, preamplifiers 14,15 for amplifying the signals selected by multiplexer 13, preamplifiers 14,15 being separate from each other with one preamplifier being of a signal system from the thermocouple 1, and the other being of a signal system from the thermister 11, a second multiplexer 16 for selecting an imparting signals from preamplifiers 14,15 to the A/D converter 2, and a microprocessor 7 for receiving digital signals transmitted from the A/D converter 2.

Microprocessor 7 comprises an arithmetic unit 71, also labelled as a CPU, a ROM 72 for storing a table comprising a variety of programs and arithmetic data and other necessary or desired data, a RAM 73 for storing arithmetic formula data and multiple data given from the outside, an input port 74, an output port 75, a communication interface clock CLK, counter CU, an EEPROM 77 for storing data on, e.g. the type of thermocouple and temperature measuring range or span. These components are connected to each other through a bus 78. The output port 75 of microprocessor 7 is connected to multiplexers 16 and 13 for control thereof.

By executing programs stored in the ROM 72, CPU 71 functions as a setting means 6 in cooperation with arithmetic means 3, pulse outputting means 4, which are all depicted in FIG. 1, and data inputting means 8 which will be discussed hereinafter.

Also provided is a photo isolator 17 for isolating and outputting pulse signals outputted from microprocessor 7. An output amplifier 18 amplifies signals from smoothing means 5. A DC/DC converter 19 is provided for supplying operating isolation power sources to the respective units.

A data inputting means 8 inputs and imparts data on, for example, the type of thermocouple and temperature measuring range, to the microprocessor 7, and comprises a microprocessor (CPU) 81, a keyboard 82 for inputting data, a display unit 83, a communication interface 84 and a memory 85. When inputting data, a communication line 9 is connected through connector CC. Through this communication line 9, data which are inputted by keyboard 82 are transferred to microprocessor 7. Microprocessor 7 is accessed as necessity arises or is desired. Display unit 83 displays data stored in RAM 73 and the input signals from sensor 1 or output signals.

Figure 3:
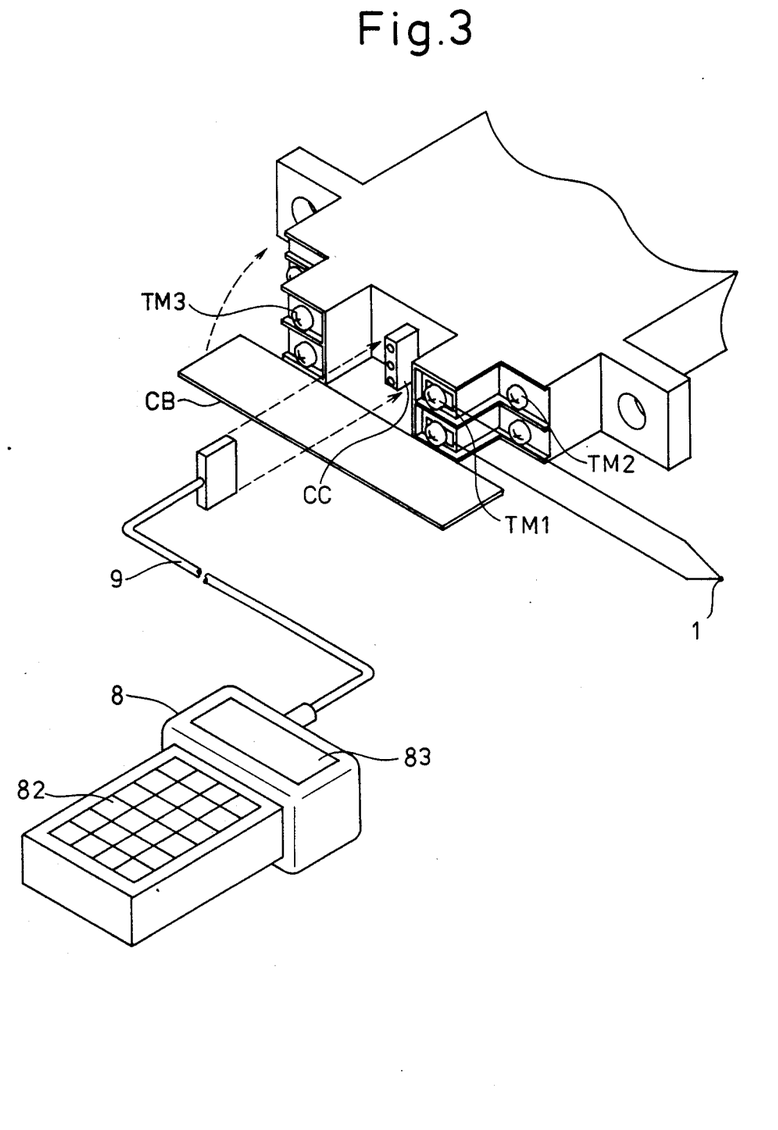
FIG. 3 is a conceptual view depicting the outer appearance of the invention.

FIG. 3 is a conceptual view illustrating the external appearance of the embodiment, wherein the circuit as a whole is encased in a small casing. One side surface of the embodiment is provided with a terminal TM1 for receiving signals from thermocouple 1, a terminal TM2 to which a power source is connected, a terminal TM3 from which the output signal is obtained and a connector CC to which communication line 9 is connected.

A cover CB is arranged in such a manner that when connecting the signal lines or the power source lines to the individual terminals or inputting data by connecting communication line 9, as depicted in FIG. 3, the cover is opened. At other times, the cover CB is closed.

The operation of the embodiment is as follows. Communication line 9 of data inputting means 8 is connected through connector CC to microprocessor 7. The data on the type of thermocouple to be connected the temperature measuring range are inputted by operating keyboard 82. Data are transferred via communication line 9 to microprocessor 7. After data inputting means 8 has inputted the data to microprocessor 7, data inputting means 8 is demounted from connector CC and is covered with cover CB to protect the terminals.

Upon receipt of data, microprocessor 7 stores the data in predetermined regions of RAM 73 and EEPROM 77.

Thermoelectromotive force $E_x$ from thermocouple 1, as above discussed, ranges from $-20mV$ to $+80$ mV. Thermoelectromotive force $E_x$ is selected by first multiplexer 13 and is converted into a digital value by use of preamplifier 14 and A/D converter 2. First multiplexer 13 serves to select reference voltage $V_{ref}$, a voltage Vs generated in resistance $R_{ref}$ and a voltage $E_s$ generated in thermistor 11. These voltages are converted into digital values by A/D converter 2, to impart them to microprocessor 7.

Microprocessor 7, which has received the digital values, at first reads the data indicating the type of thermocouple 1 that are set by data inputting means 8, from the predetermined regions of RAM73 and EEPROM 77. Based on these data, the arithmetic operations for temperature conversion are done by using the associated conversion table or arithmetic formulae. These arithmetic operations comprise linearizing arithmetic operation for linearizing the relation between temperature and output signal, a gain correction arithmetic operation which uses voltage $V_s$, OV and double sided voltage $E_s$ of thermistor 11, a zero correction arithmetic operation, and a reference contact correction arithmetic operation.

A dynamic range of temperature signals which is obtained by the above described arithmetic operations, contains values as low as $-273°$ C. and as high as $+2000°$ C.

Next, microprocessor 7 reads the data concerning the temperature measuring range specified by data inputting means 8 from RAM 73 by performing the function of the pulse outputting means 4. If the temperature measuring range falls within the scope of ,e.g. 0 to 300° C., there are outputted cyclic pulses with a 0% duty ratio to 0° C. data, a 100% duty ratio to 300° C. data, and a 50% duty ratio to 150° C. data.

The pulse signals outputted from microprocessor 7 are signals isolated by photo isolator 17 and are applied to smoothing means 5. Smoothing means 5 comprises, for example, a low pass filter which output an analog signal proportional to pulse width modulation. Amplifier 18 outputs the analog signal as a standard signal, e.g. as a voltage signal of 1 to 5 V.

In the above embodiment, a thermocouple is used as a sensor and the signals transmitted therefrom are used as inputs. However, output signals from a temperature measuring resistance and a potentiometer and other signals from a pressure sensor and flow rate sensor may also be used as input signals. As a rewritable memory means, the RAM and EEPROM are provided; however, any one of them may be used alone.

The embodiment is capable of varying the type of sensor to be connected. The range or span can be easily and flexibly varied according to engineering requirements.

Figure 4:
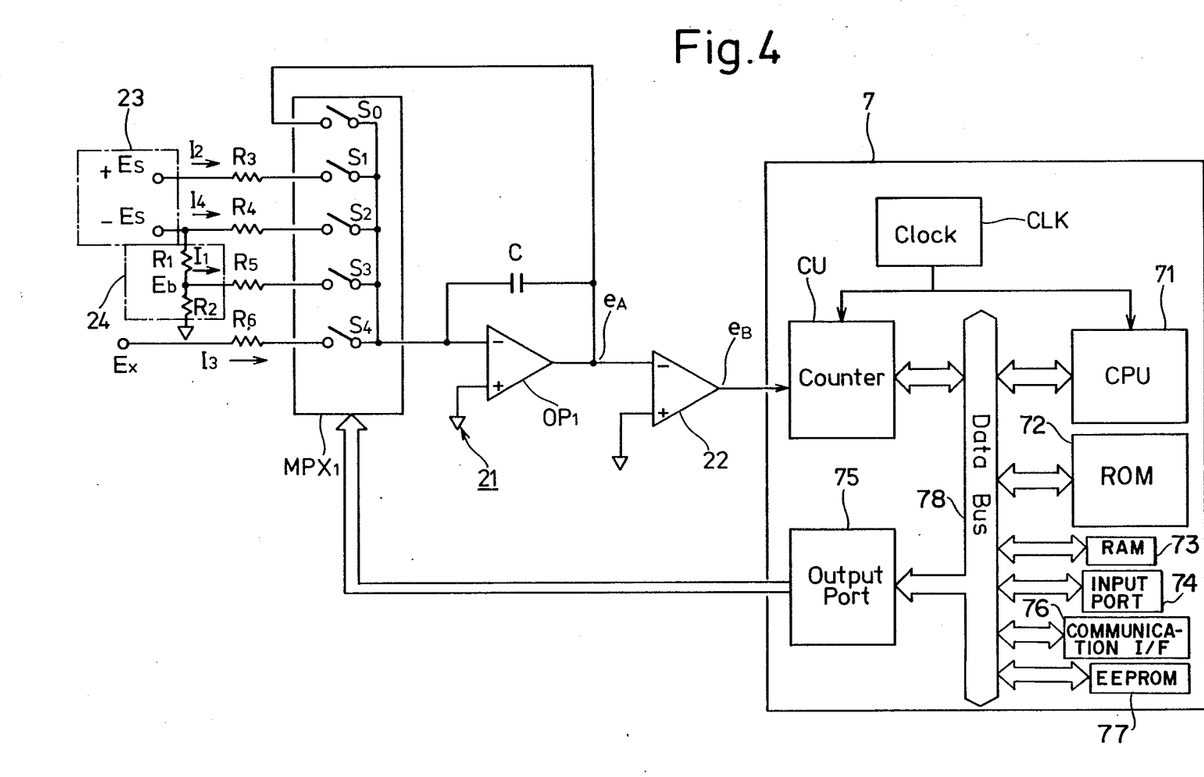
FIG. 4 is a block diagram depicting an illustrative A/D converter which is used in the invention.

FIG. 4 depicts an A/D converter 2 comprising an integrator 21 comprising an arithmetic amplifier OP1, a capacitor C and resistances $R_3$ to $R_6$. A comparator 22 compares an output of integrator 21 with a common level and supplies the output thereof to counter unit CU incorporated into microprocessor 7.

A reference voltage source 23 outputs a reference voltage $\pm E_s$. In a preparatory integration power source 24, the reference voltage $-E_s$ is divided by resistance $R_1$ and $R_2$.

Microprocessor 7 further comprises a CPU 71 and memory (ROM 72) connected by the data bus 78, a clock source CLK and an output port 75 which operates in synchronism with clock signals, such as clock pulses, from clock source CLK. Also connected to bus 78 are RAM 73, input port 74, communication interface 71 and EEPROM 77.

Multiplexer MPX1, having a plurality of switches S0 to S4, is designed for sequentially imparting signal $+E_s$, signal $-E_s$ from reference voltage source 23, preparatory power source signal $E_b$ from preparatory integration power source 24 and analog signals $E_x$ from the sensor, to an input end of integrator 21, and also short circuits both ends of capacitor C.

The operation of the A/D converter 2 will now be described with reference to FIG. 5, which depicts in lines (A)–(G) an operational wave form diagram. It is assumed that the fundamental resolving power is improved four times. The below formulae (1), (2) and (3) show the relations established between resistances R1 and R2 which are combined to form the preparatory integration power source 24, and between the integration resistances R4 and R5.

$$R1/(R1 + R2) = \tfrac{1}{4}$$

$$(R1:R2 = 3:1) \tag{1}$$

$$R1 \ll R5, R2 \ll R5 \tag{2}$$

$$R4 = R5 \tag{3}$$

Figure 5:
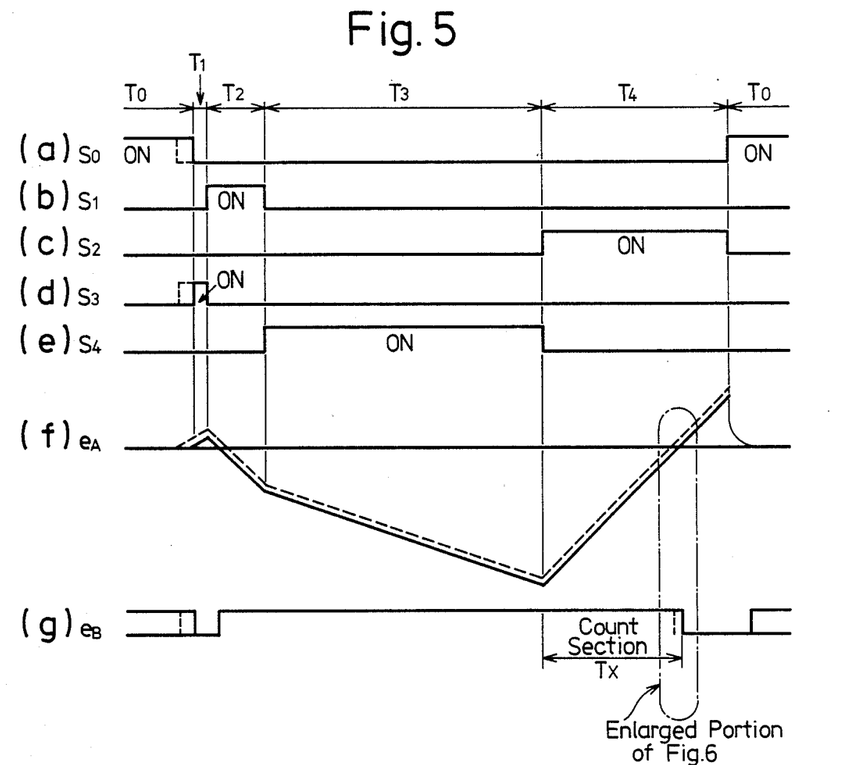
FIGS. 5, comprising lines (A)–(G), and 6, comprising lines (A)–(C), are waveform diagrams depicting operation of the invention.

Referring next to FIG. 5, lines (a)–(G), the symbol To indicates an initial state whereat switch S0 of multiplexer MPX1 is, as shown in FIG. 5, line (A), turned ON, while capacitor C of integrator 21 is short circuited. In this state, an output voltage eA of integrator 21 is nearly 0V, while an output voltage eB of comparator 22 is uncertain at either H level or L level depending on the offset voltages of arithmetic amplifier OP1 and comparator 22.

The symbol T1 represents a preparatory integrating time for obtaining high resolving power, which is characteristic of the A/D converter 2. During this integrating time, switch S3 is turned ON to integrate signals I1 coming from preparatory integration power source 24. Integrating current value I1 is expressed by below formula (4).

$$\begin{aligned} I1 &= \{R2/(R1+R2)\} \times (-Es/R5) \\ &= (\tfrac{1}{4}) \times (-Es/R5) \\ &= (\tfrac{1}{4}) \times I4 \end{aligned} \tag{4}$$

The integrating time T1 is controlled by microprocessor 7 to be distributed uniformly in a time series at any one of 1 to 4 clock pulses (i.e. clock signals from clock source CLK). This situation will be described hereinafter in greater detail.

The symbol T2 denotes another preparatory integrating time for which the A/D conversion can be effected even in the case where input analog signal $E_x$ takes a negative value. During this integrating time T2, switch S1 is, as shown in FIG. 5, line (B), turned ON. Integrator 1 integrates an amount of charge shown in formula (5) during the integrating time T2.

$$I2 \times T2 = (Es/R3) \times T2 \tag{5}$$

For a subsequent time T3, the input which offsets this charge quantity is negative. This negative input corresponds to a lower end of the input range of the A/D conversion.

The symbol T3 is defined as an input integrating section in which switch S4 is, as depicted in FIG. 5, line (E), kept ON, and an electric current I3, proportional to the input analog signal, is integrated through resistance R6 for a given period.

The symbol T4 as defined as an inverse integrating section in which switch S2 is, as depicted in FIG. 5, line (C), turned ON, and a constant current value I4, given by below formula 6, is inversely integrated.

$$I4 = -Es/R4 \tag{6}$$

The operation of the input integrating section T3 and inverse integrating section T4 are the operations in a typical double integrating circuit.

Comparator 22 compares the output voltage eA of integrator 21 with the reference voltage and amplifies the compared result. Subsequently, digital signal eB assuming H or L level is inputted to microprocessor 7. Microprocessor 7 receives an inversion signal from comparator 22 and generates timing signals of T0 to T4 to activate multiplexer MPX1. Counter unit CU counts a time Tx from the beginning of section T4 to the change from H to L of output eB of comparator 22 so that the digital signal, corresponding to the input analog signal Ex, can be obtained in counter unit CU. FIG. 5(d) shows when switch S3 of multiplexer MPX1 is turned on. FIG. 5(f) shows the signal at the output terminal eA of OP1. FIG. 5(g) shows the signal at the output terminal 3B of comparator 22.

The operation of the embodiment for obtaining high resolving power, which is a characteristic of the A/D converter, will next be discussed. The relation between integration current I1 in the preparatory integrating section T1 and integration current I4 in the inverse integrating section T4 is expressed by below formula (7).

$$I1 = (\tfrac{1}{4}) \times I4 \tag{7}$$

Hence, one clock in the preparatory integrating section is equivalent to $\tfrac{1}{4}$ clock for the inverse integrating time T4.

In FIG. 5, line (A)–(G), a timing indicated by a solid line is expressed such as T1=1 clock, while a timing indicated by the broken line is expressed such as T1=2 clocks. A variation timing of output eB of comparator 22, with respect to the same input analog signal, deviates by $\tfrac{1}{4}$ clock.

Figure 6:
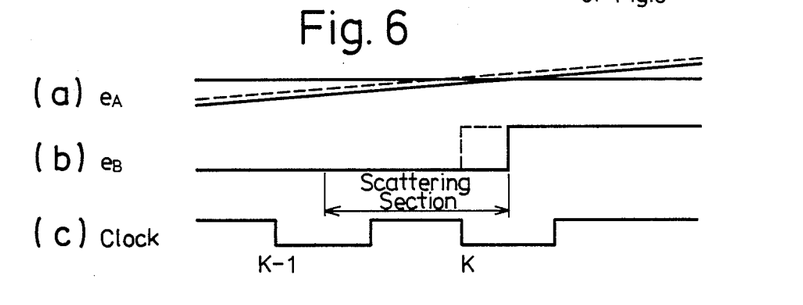

This type of A/D converter is arranged such that each A/D conversion timing is controlled to uniformly scatter the preparatory integrating time T1 provided in advance of the double integrating operation at, for example, 1 to 4 clocks. In regard to the output eB of comparator 22, the timing at which a change from L to H is done is uniformly distributed in the scattering section depicted in FIG. 6, line (B). FIG. 6(a) shows the signal at the output terminal of OP1.

Thus, a count value, ie. A/D conversion value, of counter unit CU for counting the clocks shown in FIG. 6, line (C), is $\tfrac{1}{4}$ when is counted and $\tfrac{3}{4}$ when $K-1$ is counted.

The arithmetic processing means incorporated in microprocessor 7 is arranged to obtain a highly accurate A/D conversion value Dx by evenly processing the count values of counter unit CU. Namely, in this embodiment, the average arithmetic operation shown in the formula (8) is performed.

$$Dx = (\tfrac{1}{4}) \times K + (\tfrac{3}{4}) \times (K-1) \tag{8}$$
$$= K - (\tfrac{3}{4})$$

The resolving power of A/D conversion can be improved by four times by effecting average arithmetic processing.

In order to obtain the 4-fold resolving power, the A/D conversion has to be effected at least four times However, one A/D conversion is enough to obtain an amount of information on the basic resolving power. Thus, as compared with the prior art, in which the high resolving power is acquired simply by increasing the integrating time, it is possible to reduce the A/D converting time.

Figure 7:
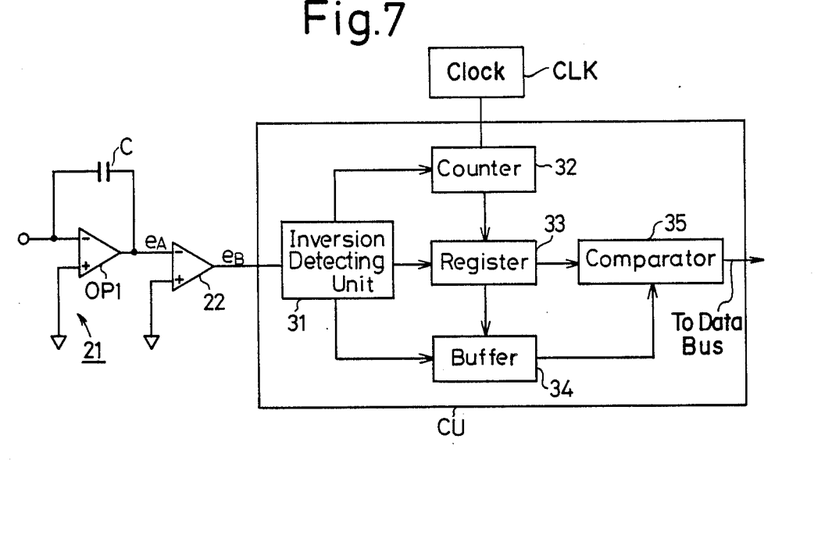
FIG. 7 is a block diagram depicting another counter unit (CU) in the A/D converter 2.

FIG. 7 illustrates another counter unit in the A/D converter 2, which comprises an inversion detecting unit 31 for detecting inversion of output eB from comparator 22, a counter 32 for counting the clock pulses or signals, a register 33 for storing the count value of counter 32 in response to the detecting signal transmitted from inversion detecting unit 31 and also for updating the content thereof, a buffer 34 for storing a value of register 33 by receiving the detecting signal from inversion detecting unit 31, this buffer 34 being thereafter disabled, and a comparator 35 for comparing the content of the register 33 with that of buffer 34 after a predetermined time has passed and when the two contents are equal, an output signal is outputted by comparator 35 to the data bus 78.

Figure 8:
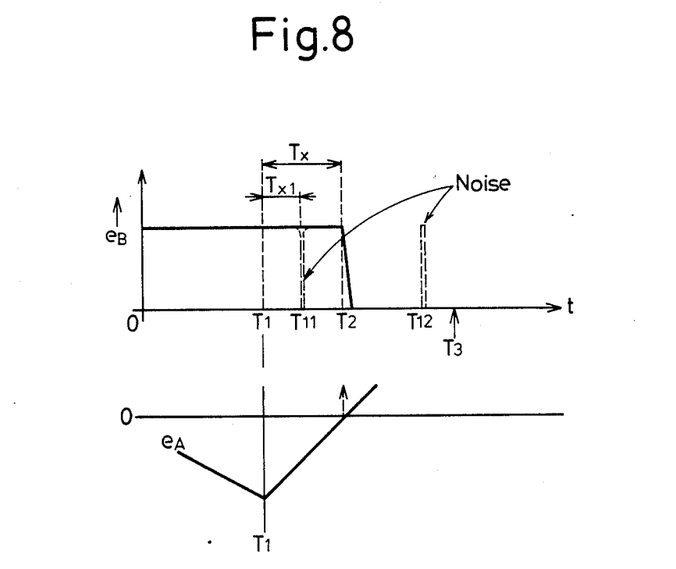
FIG. 8 is a waveform diagram depicting operation of the counter unit of FIG. 7.

FIG. 8 is a waveform diagram depicting operation of counter unit shown in FIG. 7, wherein the description at first touches on the situation where no noise is intermixed in a path to counter unit CU. Counter 32 initiates the count of clock pulses from a timing T1 at which integrator 21 starts the inverse integration. Assuming that output voltage eA of integrator 21 reaches the common level and output eB of comparator 22 is varied from the high level to a low level at a timing T2 shown in FIG. 8, inversion detecting unit 31 detects this fact and then outputs a detecting signal. Upon receipt of this detecting signal, permits buffer 34 to store the same count values Tx. Thereafter, the writing of buffer 34 is inhibited.

At a timing T3, after a predetermined time has passed, comparator 35 compares the count values stored in register 33 with the count values stored in buffer 34. As a result of this comparison, if the content of register 33 coincides with that of buffer 34, comparator 35 judges that noise influences do not exist. Then, the content of register 33 is outputted as the count value of counter unit CU.

On the other hand, where the noises are, as indicated by the broken line, intermixed at, e.g. a timing T11, the following operation is performed Inversion detecting unit 31 detects the intermixing of noises and outputs the detecting signal at timing T11. On receiving this detecting signal, register 33 stores count values T×1 counted so far by counter 32 and at the same time permits buffer 34 to store the same count value T×1. Thereafter, the writing of buffer 34 is inhibited. Note that at this timing, counter 32, it is assumed, continues to count the clock signals.

Subsequently, at timing T2 the output eB from comparator 22 varies from H (i.e. a high level) to L ( i.e. a low level). Inversion detecting unit 31 detects this variation and outputs the detecting signal. On receiving this detecting signal, register 33 stores count values T×2 counted so far by counter 32 in place of the count value T×1 stored up to that time.

At this time, buffer 34 has already been disabled, and no content is updated. After the predetermined time has passed, at timing T3, comparator 35 compares the content T×2 of register 33 with the content T×1 of buffer 34. As a result of this comparison, it is judged that the noises have been intermixed, because the contents of register 33 and and buffer 34 do not coincide with each other. Consequently, the content of count value of T×2 of the register is ignored.

If the noises are intermixed at a timing T12, the operations are the same as those in the previous case. The A/D conversion of the signals transmitted from the sensor can be executed without the noise influences by performing the above operations.

Figure 9:
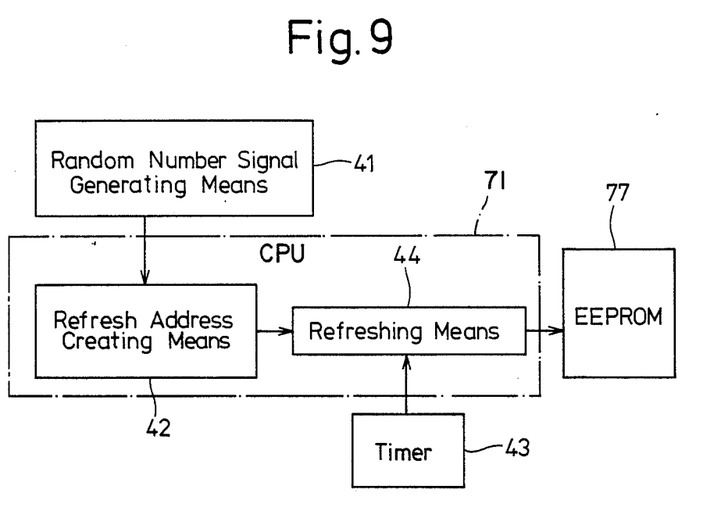
FIG. 9 is a diagram depicting a data protection circuit for the EEPROM.

FIG. 9 shows the case where an EEPROM (abbreviation for Electrically Erasable and Programmable Read Only Memory) is used to store a variety of data, and especially a data protection circuit of the EEPROM which is capable of protecting the data stored in the EEPROM while maintaining a rewritable function for a long period of time, such as 10 or more years.

The EEPROM is defined as a non-volatile memory in which a user can freely write and erase data electrically. The data can be rewritten while the EEPROM is incorporated in the system. Hence, the EEPROM has such characteristics that the data can be varied under remote control without decreasing the working efficiency of the system. For this reason, the EEPROM is utilized for ,e.g. the operation programs which require no intricate rewriting process or for the storage of arithmetic variable data.

In connection with data retention time of the data stored in the EEPROM, however, in general, storage for a period longer than 10 years usually is not required.

The stored data can be periodically refreshed so as not to erase the stored data. However, since the number of rewriting processes of the EEPROM is restricted, there exists the possibility that the number of such processes exceeds a predetermined number. This is a problem in terms of keeping the reliability. The circuit of the invention was constructed with the above points in mind.

In FIG. 9, a protective circuit is shown comprising a CPU 71 connected to an EEPROM 77 for storing data which require no intricate rewriting process, random number signal generating means 41, and a timer 43 which sets the time period for refreshing data in the EEPROM 77. The CUP 71 comprises refresh address creating means 42 for creating a top address for refreshing the EEPROM 77 with random number signals from random number signal generating means 41 when inputting the power source, a timer 43 in which a refresh period of the EEPROM 77 is set, and refreshing means 44 for refreshing the data stored in the address created by refresh address creating means 42 when the time set by time 43 occurs after the power source is turned on.

EEPROM 77 is refreshed with data, after the period set in timer 43 occurs, from the top address created by the signal sent from random number signal generating means 41 every time the power source is inputted.

Figure 10:
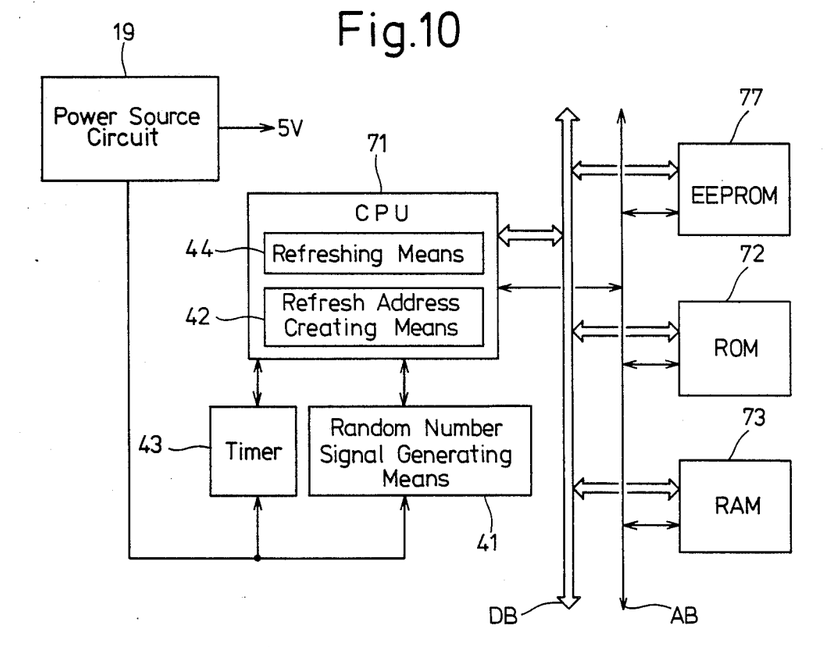
FIG. 10 is a block diagram depicting an illustrative protection circuit for the EEPROM.

FIG. 10 shows a data protection circuit for the EEPROM, wherein the same components as those depicted in FIG. 9 are marked with the same symbols. The protection circuit comprises a CPU 71, a ROM 72 for storing programs or fixed data, and a RAM 73 for storing temporary retention data. These components together with EEPROM 77 are mutually connected to a data bus DB and an address bus AB. EEPROM 77 stores parameter, which are hardly varied at all after being once written and other data. The commercially available EEPROM 77 is of such a type that the data retention is about 3 years, when used in conditions of room temperature, and the number of data writing times and erasing times are both within the number of 10,000 times. A power circuit 19 supplies electric power to the respective units. CPU 71 also functions as a refresh address creating means 42 and refreshing means 44, as well, which are both shown in FIG. 9, by executing a program stored in ROM 72.

Figure 11:
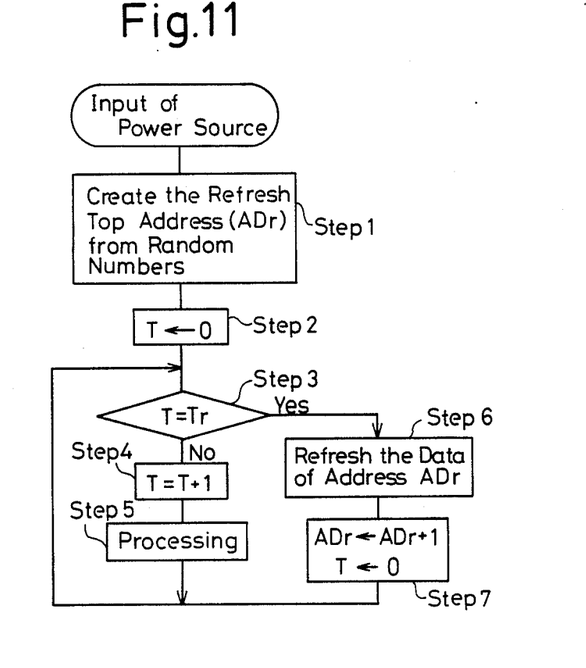
FIG. 11 is a flow chart depicting operation of the microprocessor.

FIG. 11 is a flow chart depicting operation of CPU 71. When the power source is first inputted, refresh address creating means 42 incorporated in CPU 71 receives random number signals from random number signal generating means 41 and creates a refresh top address ADr (step 1). Next, the timer is set to 0 and is brought into a starting state (step 2). It is presumed that a time Tr corresponding to a period (e.g. 2 hours) for which to refresh, e.g. one byte of EEPROM 77 is set beforehand in the timer. Then, a value T of timer 43 is monitored, and there is made a judgement as to whether the timer value T comes to a set value Tr or not (step 3).

If the timer value T does not reach the set value Tr (NO), 1 is added to the timer value T, and the normal processing assigned to the CPU 71 is executed (Steps 4 and 5). These steps 4 and 5 are repeated until the timer value T reaches the set value Tr. When reaching the set value Tr (which is judged to be YES in Step 3), the refreshing means 44 effects the refreshing steps on the address ADr created by refresh address creating means 42 (Step 6). This refreshing process is done by reading the data stored in the address ADr and writing data to address Adr once again.

Subsequently, refresh address creating means 42 sets the next refresh address so that this refresh address becomes ADr+1. A timer value of timer 43 is set to 0, and the process is returned to Step 3. (see Step 7).

In EEPROM 77, after inputting the power source on the basis of the above operations, every time the timer value of timer 43 comes to the set value Tr, the refreshing processes are sequentially executed towards the subsequent addresses from the top address determined by the random number signal On the occasion of executing these processes, provided that a 512-byte EEPROM 77 is used, the set value Tr of timer 43 is 23535, hours, and the apparatus continues to be used for 10 years after inputting the power source. The writing to one address is executed 72.7 times which is remarkably smaller than the 100,000 writing and erasing times prescribed therefor.

Where the power source is intermittently used while turning ON and OFF the power source, the address at which EEPROM 77 is first refreshed is determined at random by the random number signal from random number signal generating means 41 every time the power source is turned ON. It is feasible to refresh the data on the average which are stored in all of the addresses by turning ON and OFF the power source several times Supposing that the power source is turned ON, for example, once a day to charge the apparatus with electricity for some 8 hours, and the apparatus is operated for 20 days per month, an equivalent data retention time exhibits 204 years, using the criteria that data retention time divided by the probability that one byte of 512 bytes is not refeshed under the foregoing conditions.

If the refresh top address is not determined by the random number signal, it is required that 512 bytes be refreshed once every 8 hours under the above conditions. In this case, a refresh period Tr is 0.015625 hour, and the number of writing and erasing times becomes 10,950, which values exceed those prescribed for the device.

In the above embodiment, random number signal generating means 41 and timer 43 are shown in the form of dependent blocks. However, CPU 71 can also have the functions of random number signal generating means 41 and timer 43.

Figure 12:
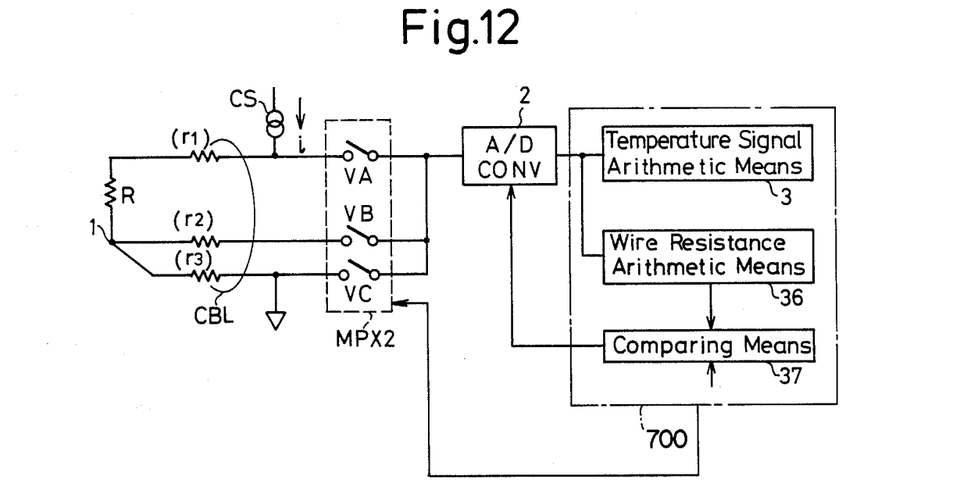
FIG. 12 is a block diagram depicting the important functions of another illustrative embodiment of the invention.

FIG. 12 shows the signal conditioner when using a temperature measuring resistor as sensor 1. Where a temperature measuring resistor is substituted for sensor 1, in some cases a current restriction resistance is interposed in the signal path leading to the temperature measuring resistor for the purpose of preventing harmful defects, such as explosions from occurring and thereby to insure safety. In this case, the dynamic range set in the A/D converter has to be determined, taking the current restriction resistor into consideration. In this embodiment, the dynamic range of the A/D converter is automatically varied depending on the magnitude of size of resistance interposed in the signal path to the temperature measuring resistance. It is possible to invariably obtain the signal with high accuracy which exactly corresponds to the measured temperature, irrespective of whether the current restriction resistance is interposed in the signal path or not.

In FIG. 12, there is depicted a temperature measuring resistor 1 used as a sensor, a signal path (e.g. lead wires) CBL led from resistor 1, lead wire resistances r1, r2, r3, a constant current source CS for supplying a constant current i to resistor 1, a multiplexer MPX2 for sequentially changing over and obtaining voltages VA, VB and VC at one ends of the lead wires r1, r2, r3, an A/D converter 2 for effecting A/D conversion of voltage signals obtained by multiplexer 2, the dynamic range of which is variable, and a microprocessor 700.

The microprocess 700 comprises a temperature signal arithmetic means 3 for obtaining a temperature signal by doing a predetermined arithmetic operation while receiving a digital signal from A/D converter 2, resistance arithmetic means 36 for obtaining a wire resistance on the signal path CBL by performing a predetermined arithmetic operation while receiving the digital signal from A/D converter 2, and comparing means 37 for comparing the wire resistance value obtained by arithmetic means 36 and comparing this value with a predetermined value. Microprocessor 7 could execute programs stored in ROM (not shown) to perform the operations of temperature signal arithmetic means 3, wire resistance arithmetic means 36 and comparing means 37. The microprocessor 700 is connected to multiplexer MPX2 for control thereof.

The operation of the embodiment of FIG. 12 is as follows. Constant current i , fed from constant current source CS, flows in temperature measuring resistor 1, thereby to generate voltage signals VA, VB, and VC at one ends of lead wires CBL. These voltage signals are sequentially selected by multiplexer MPX2 and converted into digital signals by means :of A/D converter 2. Wire resistance arithmetic means 3 incorporated in microprocessor 700 computes the wire resistance r3 on the signal path, i.e. lead wire, in conformity with the below arithmetic equation (9).

$$VB - VC = r3 \cdot i \qquad (9)$$

Comparing means 37 compares an arithmetically obtained value of wire resistance r3 with a predetermined wire resistance value. Based on this compared result, it is possible to know whether the current restriction resistance is inserted in the signal path or not. If the wire resistance is greater than the predetermined value, it is judged that the current restriction resistance is inserted therein Subsequent to this step, the dynamic range of the A/D converter 2 is set in a normal mode (e.g. mode having a wider resistance measurable range of, e.g. 0 to 700 ohms.) If smaller than the predetermined value, it is judged that the current restriction resistance is not inserted. The dynamic range is changed over to a high resolving power mode (e.g. mode having resistance measurable range of ,e.g. 0 to 460 ohms). Once such a change over of mode is carried out, the data indicating the modes are stored in an EEPROM (not shown).

Figure 13:
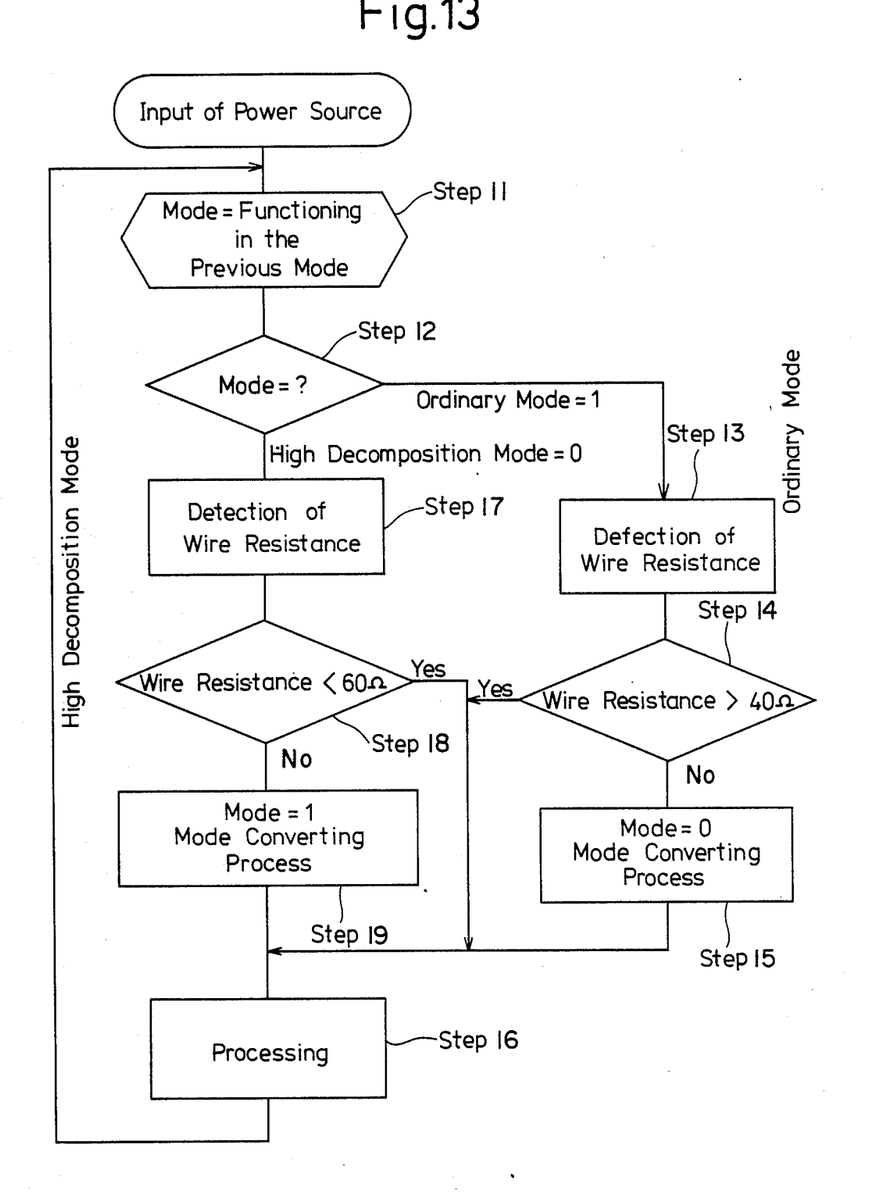
FIG. 13 is a flow chart depicting operation of the microprocessor 7.

FIG. 13 illustrates the operations performed by microprocessor 700, wherein upon inputting the power source, microprocessor 700 at first functions in the previous mode, and whether this mode is the normal mode or the high resolving power mode is judged (Steps 11 and 12).

If judged as the normal mode in Step 12, the wire resistance is measured, and whether the wire resistance value is in excess of, e.g., 40 ohms or not is judged (Steps 13 and 14). If greater than 40 ohms, the dynamic range remains in the normal mode, and a given process is executed (Step 16). If it is judged that the wire resistance value is smaller than 40 ohms in the step 15, no current restriction resistance is, it can be considered, interposed in the signal path. Then, the dynamic range is changed over to the high resolving power mode (Step 15). In this mode change over process, the dynamic range is changed over to 0 through 460 ohms, in combination with an A/D converter 2 and a preamplifier connected to the input of the A/D converter.

If judged as the high resolving mode in step 12, the wire resistance is measured, and whether the wire resistance value is smaller than , e.g. 60 ohms or not is judged (Steps 17 and 18). If the value is smaller than 60 ohms, the dynamic range is kept in the high resolving power mode. Subsequently, a given process is executed (Step 16). If it is judged that the wire resistance value exceeds 60 ohms, the current restriction resistance is, it can be considered, inserted in the signal path. Then, the dynamic range is changed over to the normal mode (Step 19). In this mode change over process, the dynamic range is changed over to 0 through 700 ohms, in combination with the A/D converter 2 and the unillustrated preamplifier provided on the side of input of the A/D converter 2.

Based on the foregoing operations, when measuring resistance values 17 to 340 ohms of, e.g., a platinum temperature measuring resistor, the dynamic range is 0 to 700 ohms on the assumption that the current restriction resistance is interposed in the signal path. On the other hand, if no current restriction is interposed therein, the dynamic range is automatically changed over to the high resolving power mode, whereby 1.5 fold accuracy can be obtained.

In the above embodiment, when the power source is inputted, the wire resistance is measured. When changing the connection of the lead wire to the temperature measuring resistor, however, the wire resistance may be measured on the basis of a command issued from the data inputting means or the like.

Figure 14:
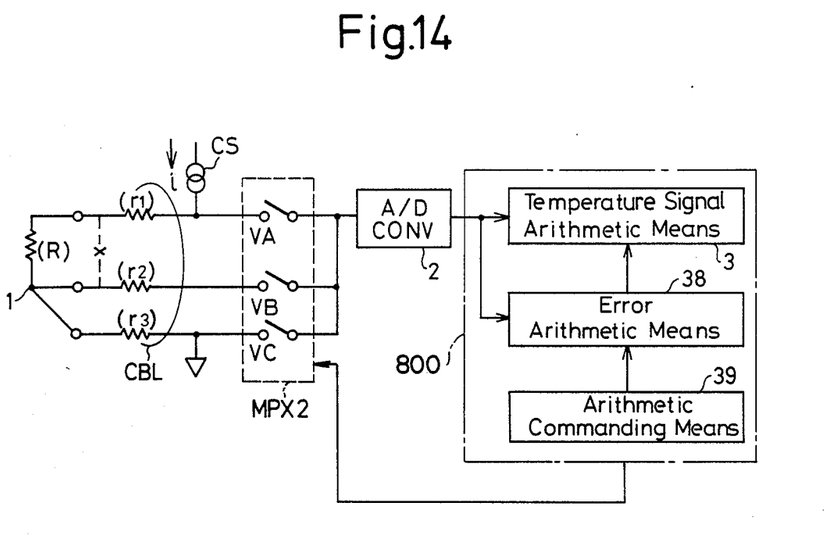
FIGS. 14 and 15 are block diagrams which in combination depict a further illustrative embodiment of the invention.
Figure 15:
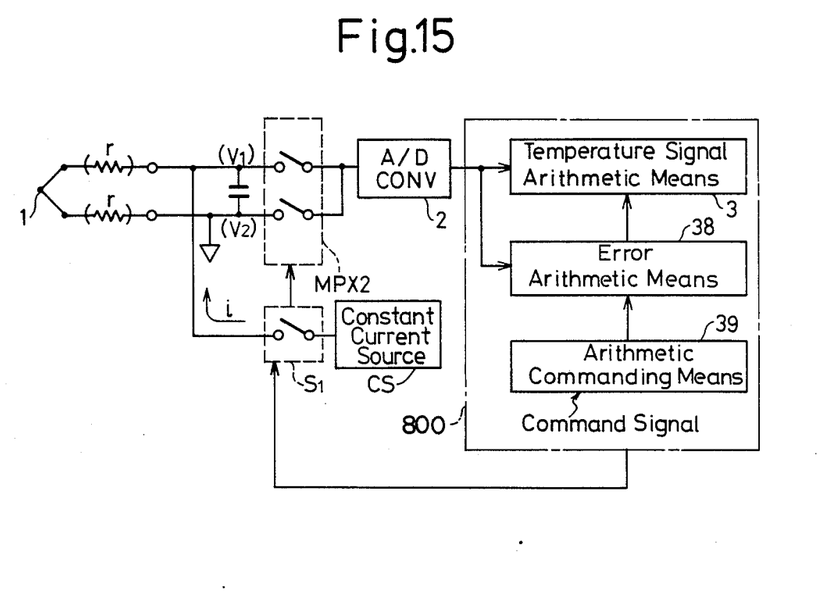

FIGS. 14 and 15, in combination, depict another illustrative embodiment, wherein the influences of individual resistances of the lead wires connected to the sensor are eliminated. FIG. 14 depicts an arrangement similar to FIG. 12 and the same components thereof will not be further discussed hereat. A temperature resistor is used as a sensor. Microprocessor 800 comprises an error arithmetic means 38 for computing an error caused by imbalance between the wire resistances r1,r2,r3 on inputting the signals when short circuiting both ends of temperature resistor 1, serving as the sensor, or when connecting a reference resistance having a predetermined resistance value, and arithmetic commanding means 39 for causing the error arithmetic means to operate in accordance with the instruction signal transmitted from, e.g. data inputting means, although this is not shown hereat. Microprocessor 800 is connected to multiplexer MPX2 for control thereof.

In this embodiment, if there is created some imbalance between wire resistances r1,r2,r3 of the lead wires leading to resistor 1, when for example, $r1 = r + \Delta r$, and $r3 = 3$, the below formula (10) and below formula (11) will be established.

$$VA - VC = (R + 2 \cdot r + \Delta r) \cdot i \qquad (10)$$

$$VB - VC = r \cdot i \qquad (11)$$

wherein R is the resistance value of the temperature resistor 1.

The following formula (12) can be obtained from formulae (10) and (11).

$$R \cdot i = VA - 2 \cdot VB + VC - 2 \cdot \Delta r \cdot i \qquad (12)$$

wherein the term of $2 \cdot \Delta r \cdot i$ is the error attributed to the imbalance between the wire resistances of the lead wires.

In order to obtain this error both ends of temperature measuring resistor 1 are at first, as indicated by the broken line, short circuited in this embodiment. In this state, multiplexer MPX2 is driven, and voltage signals VA, VB and VC at one ends of the lead wires, are sequentially inputted.

Next, arithmetic commanding means 39 outputs an arithmetic command to error arithmetic means 38. The arithmetic operation for obtaining the error $2 \cdot \Delta r \cdot i$ is performed in conformity with below formula (13). The arithmetic command is issued on the basis of an instruction given from the data inputting means 8.

$$2 \cdot \Delta r \cdot i = VA - 2 \cdot VB + VC \qquad (13)$$

Specifically, when both ends of temperature measuring resistor 1 are, as indicated by the broken line, short circuited , error $2 \cdot \Delta r \cdot i$ can be obtained from formula (13), because the term of $R \cdot i$ comes to 0 in equation (12). When finishing the arithmetic operation for obtaining this error, the short circuiting of both ends of temperature measuring resistor 1 ceases.

The thus obtained error is stored in the EEPROM and is given to temperature signal arithmetic means 3, where the arithmetic operation associated with formula (12) is conducted while considering this error. As a result, it is feasible to acquire a temperature signal with no error caused by the imbalance between the wire resistance of the lead wires.

When computing the error, both ends of the temperature measuring resistor 1 are short circuited. Instead, however, a reference resistor having a given value may be connected.

FIG. 15 shows an example in which a thermocouple 1 is used as a sensor. The symbol r indicates a resistance of each lead wire of thermocouple 1. A constant current source CS supplies a constant current i via a switch S1 to thermocouple 1. Current i is a measurement current for detecting a disconnected state of thermocouple 1.

Microprocessor 800 comprises an error arithmetic means 38 for computing an error caused by imbalance between wire resistance r and constant current i on inputting voltage signals V1 and V2 from thermocouple 1 when turning ON and OFF switch S1, and arithmetic commanding means 39 for causing error arithmetic means 38 to function in accordance with an instruction signal transmitted from, e.g., a data inputting means (not shown hereat). Microprocessor 800 is connected to multiplexer MPX2 and switch S1 for control thereof.

Switch S1 is turned ON when measuring the temperature, while the constant current i from the constant current source CS flows through the lead wires and thermocouple 1, to thereby generate voltage signals V1 and V2 at one ends of the lead wires. Voltage signals V1 and V2 are in regular sequence selected by multiplexer MPX2 and converted into digital signals by use of A/D converter 2. Temperature signal arithmetic means 3 provided in microprocessor 800 serves to compute a potential difference VX between voltage signals V1 and V2. Then, a temperature signal VC from thermocouple 1 is obtained by performing an arithmetic operation in the following formula (14) wherein an error associated with the values of the lead wire resistances is subtracted from the potential difference.

$$VX = V1 - V2$$

$$VC = VX - 2 \cdot i \cdot r \quad (14)$$

wherein the error $2 \cdot i \cdot r$ has a magnitude which can be ignored in terms of accuracy but is variable as the lead wire resistance r changes.

To prevent device operation, such as an explosion, and to secure the safety of the equipment, a current restriction resistance may be interposed in the middle of the lead line. In that case, a measurement error will result. Also, depending on the type of thermocouple used and wiring conditions existing, various performance problems will result.

Let the potential difference in an ON state of switch S1 be $VX_{ON}$, then the following equation (15) is established.

$$VC = VX_{ON} - 2 \cdot i \cdot r \quad (15)$$

wherein $2 \cdot i \cdot r$ is unknown. Hence, an accurate VC can not be obtained.

In this embodiment, where the current restriction resistance is interposed in the middle of the lead wire for reason of safety in preventing explosions, while taking the type of thermocouple 1 and wiring conditions into consideration, and when $2 \cdot i \cdot r$ can not be ignored, there is connected data inputting means 8 from which the arithmetic command is outputted.

Microprocessor 800 which has received this command at first turns OFF switch S1. In this state, constant current i does not flow through the lead wire, so that formula (14) may be expressed in the form of equation (16). Consequently, VC with no error can be obtained. The potential difference in this state is $VX_{OFF}$ $$VC = VX_{OFF} \quad (16)$$

Error arithmetic means 38 seeks the unknown error $2 \cdot i \cdot r$ from above formulae (15) and (16).

$$2 \cdot i \cdot r = VX_{ON} - VX_{OFF} \quad (17)$$

The thus obtained error $2 \cdot i \cdot r$ to be corrected is stored in EEPROM 77 and is imparted to temperature signal arithmetic means 3.

Next, switch S1 is turned ON, thereby providing a normal temperature measuring state. In this state, the constant current i from the constant current source CS flows in the lead wire as a burn out detecting current.

Temperature signal arithmetic means 3 receives the correction error $2 \cdot i \cdot r$ computed by error arithmetic means 38, and the temperature signal is computed in comformity with formula (14). Namely, in accordance with this embodiment, it is possible to flexibly obtain the temperature signal with no error, even if the wiring conditions of the lead wires are varied. For example, a K-type thermocouple 1 is used, and there flows a current $i = 0.1$ μA, which comes from the source CS. Then, the current restriction resistance, e.g. of $r = 235$ ohms, is interposed in the middle of the lead wire. In this case, an error of 1.2° C. is present in the vicinity of 0° C. In this embodiment, such an error can be eliminated.

The foregoing description is illustrative of the principles of the invention. Numerous extensions and modifications thereof would be apparent to the worker skilled in the art. All such modifications and extensions are to be considered to be within the spirit and scope of the invention.

What is claimed is:

1. A signal conditioner comprising
   an A/D converter for converting a signal transmitted from a sensor into a digital signal;
   arithmetic means for performing a predetermined arithmetic operation on said digital signal;
   pulse outputting means for outputting a pulse signal with a duty ratio corresponding to an arithmetic result obtained by said arithmetic means;
   smoothing means for smoothing said pulse signal and for outputting said pulse signal as a predetermined standard signal; and
   setting means for setting data used for said arithmetic operation by said arithmetic means and for outputting conditions of said pulse outputting means on receiving a signal from a source external to said signal conditioner.

2. The conditioner of claim 1, wherein said setting means comprises attachable and detachable data inputting means, and means for receiving data from said data inputting means.

3. The conditioner of claim 2, wherein, said sensor detects temperatures, and data representing type of sensor and temperature range are received from said data inputting means.

4. The conditioner of claim 1, wherein from a counting means in said A/D converter and effects averaging arithmetic processing; and wherein said A/D converter comprises
an integrator;
a reference power source;
a preparatory integration power source for outputting a voltage with a predetermined ratio to a voltage from said reference power source;
a multiplexer for selecting and inputting an input analog signal from said sensor, a reference signal and a preparatory power source signal to said integrator;
a comparator for inputting an output from said integrator;
said counting means for inputting a signal from said comparator;
and a controlling means for inputting said signal from said comparator and for controlling said multiplexer, said integrator and said counting means, wherein said controlling means performs the steps of applying said input analog signal and said reference signal to said integrator for executing double integration processes while controlling said multiplexer; causing said integrator to execute a preparatory integration process by applying a preparatory power source signal thereto before carrying out an inverse integration process of said double integration process; and causing every A/D conversion period and preparatory integrating time to vary within a range of 1 to N pulses counted by said counting means.

5. The conditioner of claim 4, wherein said counting means comprises
a comparator;
an inversion detecting unit for detecting inversion of a signal from said comparator;
a counter for counting clock signals;
a register for holding a count value of said counter in accordance with a detecting signal from said inversion detecting unit; and
a buffer for obtaining a retention value of said register in response to said detecting signal from said inversion detecting unit, said buffer being thereafter disabled; and wherein
the content of said register is compared with the content of said buffer, and when said contents coincide with each other, said contents are outputted as count values from said counting means.

6. The conditioner of claim 1, wherein said arithmetic means and said pulse outputting means comprise a microprocessor having a memory, and wherein said data given from said setting means are stored in said memory.

7. The conditioner of claim 6, wherein said memory comprises an EEPROM.

8. The conditioner of claim 7, further comprising a protection circuit for said EEPROM comprising
a random number signal generating means;
a timer for setting a timer after power is turned on for refreshing data in said EEPROM; and
a central processing unit connected to said random number signal generating means, said timer and said EEPROM and comprising
a refresh address creating means for creating a top address for refreshing said EEPROM by a random number from said random number signal generating means, and
refreshing means for refreshing said data stored in said address created by said address creating means when said time set by said timer occurs.

9. A signal conditioner comprising
a temperature measuring resistor;
a constant current source for supplying a constant current to said temperature measuring resistor;
a multiplexer for sequentially changing over and obtaining voltages at one end of each of a plurality of lead lines leading to said temperature measuring resistor;
an A/D converter having a variable dynamic range within which A/D conversion of said voltage signals obtained by said multiplexer is effected;
temperature signal arithmetic means for obtaining a temperature signal by performing a predetermined arithmetic operation while receiving a digital signal from sand A/D converter;
resistance arithmetic means for obtaining a wire resistance on a signal path including said lead wires by performing a predetermined arithmetic operation while receiving said digital signal from said A/D converter; and
comparing means for comparing said wire resistance value given by said resistance arithmetic means with a predetermined value so that said variable dynamic range of said A/D converter is varied on the basis of a compared result given by said comparing means.

10. A signal conditioner comprising
a temperature measuring resistor;
a constant current source for supplying a constant current to said temperature measuring resistor;
a multiplexer for sequentially changing over and obtaining voltage at one end of each of a plurality of lead wires leading to said temperature measuring resistor;
an A/D converter for effecting A/D conversion on said signals obtained by said multiplexer;
temperature signal arithmetic means for obtaining a temperature signal by performing a predetermined arithmetic operation while receiving a digital signal from said A/D converter;
error arithmetic means for computing an error caused by imbalance between wire resistances by inputting said signals at one ends of said lead wires either when short circuiting both ends of said temperature measuring resistor or in the alternative when connecting a reference resistance having a predetermined resistance value; and
arithmetic commanding means for causing said error arithmetic means to function in accordance with a command signal from the outside, wherein said temperature signal arithmetic means receives error data obtained by said error arithmetic means and computes said temperature signal while taking said error into consideration.

11. A signal conditioner comprising
a thermocouple;
a constant current source for supplying a constant current through a switch to said thermocouple;
a multiplexer for sequentially changing over and obtaining voltages at one end of each of a plurality of lead wires leading to said thermocouple;
an A/D converter for performing A/D conversion on said voltage signals obtained by said multiplexer;

temperature signal arithmetic means for obtaining a temperature signal by performing a predetermined arithmetic operation while receiving a digital signal from said A/D converter;

error arithmetic means for computing an error associated with wire resistances of said lead wires by receiving said digital signals from said respective voltage signals when turning ON said switch and when turning OFF said switch; and arithmetic commanding means for causing said error arithmetic means to function in accordance with a command signal from the outside, wherein said temperature signal arithmetic means receives error data obtained by said error arithmetic means and computes said temperature signal while taking said error into consideration.

* * * * *